United States Patent [19]

Lockwood

[11] Patent Number: 4,654,600
[45] Date of Patent: Mar. 31, 1987

[54] PHASE DETECTOR

[75] Inventor: Larry R. Lockwood, McMinnville, Oreg.

[73] Assignee: Tektronix, Inc., Beaverton, Oreg.

[21] Appl. No.: 771,542

[22] Filed: Aug. 30, 1985

[51] Int. Cl.[4] ............ H03K 17/94; H03K 17/74; G01R 25/00; G11C 27/02
[52] U.S. Cl. ..................... 328/151; 307/352; 307/516; 333/103; 333/161
[58] Field of Search ............... 307/256, 259, 319, 352, 307/510, 514, 516, 519; 328/151; 333/20, 103, 104, 161

[56] References Cited

U.S. PATENT DOCUMENTS

| | | | |
|---|---|---|---|
| 2,981,832 | 4/1961 | Mattson | 307/259 |
| 3,492,501 | 1/1970 | Allen et al. | 333/103 |
| 3,629,731 | 12/1971 | Frye | 307/259 |

Primary Examiner—John Zazworsky
Attorney, Agent, or Firm—Francis I. Gray

[57] ABSTRACT

A phase detector uses the junction of a coplanar waveguide and a slot line. The coplanar waveguide serves as an input terminal and is contiguous to the slot line which is shorted. A strobe pulse is applied to the shorted slot line via a snap-off diode, and an input signal is passed via sampling diodes and capacitors to a common mode output.

3 Claims, 1 Drawing Figure

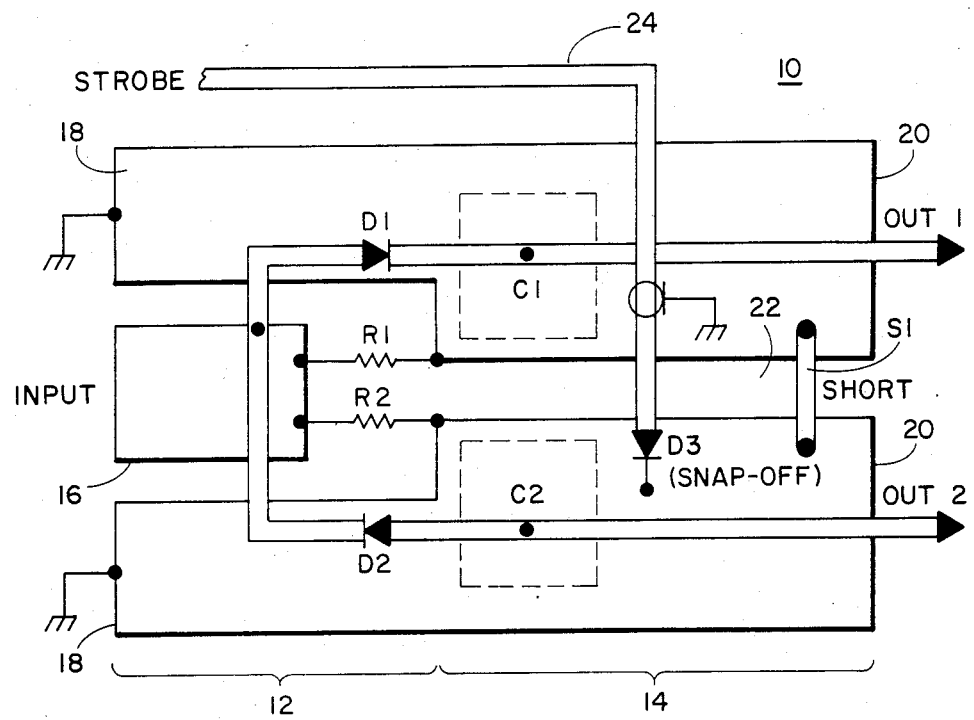

PHASE DETECTOR

BACKGROUND OF THE INVENTION

1. Field of the Invention

The present invention relates to phase detector circuits, and more particularly to a phase detector using the junction of a coplanar waveguide and a slot line.

2. Description of the Prior Art

Prior phase detector, or sampling, circuits at microwave frequencies have used microstrip technology. Such a circuit is shown in U.S. Pat. No. 3,760,283 issued Sept. 18, 1973 entitled "Sampling Device" by Larry R. Lockwood. The frequency response of this circuit is limited by the thickness of the substrate, allowing undesired modes in the strobe and input signal paths.

What is desired is a phase detector which is not frequency response limited by the thickness of the substrate; but can still be fabricated by photolithographic techniques.

SUMMARY OF THE INVENTION

Accordingly, the present invention provides a phase detector which uses the junction of a coplanar waveguide and a slot line. A coplanar waveguide serves as the input terminal and is contiguous with a shorted slot line. A strobe pulse is applied to the shorted slot line via a snap-off diode, and the input signal is passed via sampling diodes and capacitors to a common mode output.

Objects, advantages and novel features of the present invention will be apparent from the following detailed description when read in conjunction with the appended claims and attached drawing.

BRIEF DESCRIPTION OF THE DRAWING

The FIGURE is a top plan view of a phase detector on a substrate according to the present invention.

DESCRIPTION OF THE PREFERRED EMBODIMENT

Referring now to the FIGURE a phase detector 10 is shown having a coplanar waveguide 12 and a contiguous slot line 14. The coplanar waveguide 12 includes an input conductor 16 and adjacent ground conductors 18. The slot line 14 is formed by a pair of adjacent conductors 20 which are contiguous extensions of the ground conductors 18 with a small gap 22 between the conductors. The coplanar waveguide 12 is terminated by resistors R1 and R2 which extend from the input conductor 16 to the ground planes 18, respectively. The values of R1 and R2 are each equal to twice the characteristic impedance of the coplanar waveguide 12. The termination of the coplanar waveguide also is connected via oppositely poled diodes D1 and D2 to capacitors C1 and C2. The anode of D1 and the cathode of D2 are connected to the input conductor 16, while the cathode of D1 and anode of D2 are connected to one plate of C1 and C2, respectively. The opposite plates of C1 and C2 are grounded. The ungrounded plates of C1 and C2 are connected to output terminals OUT1 and OUT2.

The ends of the slot line conductors 20 furthest from the termination of the coplanar waveguide 12 are shorted by strap S1. A strobe input line 24 is connected to the slot line 14 via a snap-off diode D3.

In operation the input signal, INPUT, is applied via the coplanar waveguide 12 to diodes D1 and D2. With a small signal passing down the output lines, charge builds up on capacitors C1 and C2, causing diodes D1 and D2 to be non-conducting and terminating the signal in resistors R1 and R2. To sample a portion of INPUT, a step wave is applied via snap-off diode D3. The snap-off diode D3 is normally conducting and is turned off by a negative STROBE pulse. The STROBE pulse removes the charge on the snap-off diode, and a fast transition to the off state takes place. The voltage across snap-off diode D3 does not follow the STROBE pulse due to the storage of minority current carriers which have been injected through the diode junction during the normally conducting condition. The voltage across the diode D3 increases at a rapid rate to produce an output step which has a faster rise time than the STROBE pulse.

The step wave generated by the snap-off diode D3 propagates down the slot line 14 and is reflected and inverted by the shorting strap S1. This results in a rectangular pulse traveling toward the diodes D1 and D2, allowing INPUT to be connected to the capacitors C1 and C2, and thus to the output as a common mode signal. The shorted slot line 14 acts as a balun to provide a balanced pulse drive for diodes D1 and D2. Since all conducting media are on a single plane, the thickness of the substrate has no impact upon the frequency response while the circuits may be fabricated by standard photolithographic techniques.

Thus, the present invention provides a phase detector using the junction of a coplanar waveguide and a slot line to eliminate undesired modes in the strobe and input signal paths caused by the thickness of the substrate while retaining a photolithographic fabrication capability.

What is claimed is:

1. A phase detector comprising:
   an input coplanar waveguide;
   a shorted slot line joining said input coplanar waveguide;
   means for generating a strobe pulse, said strobe pulse being applied to said phase detector via said shorted slot line such that a sample of an input signal introduced at said input coplanar waveguide is output from said phase detector during said strobe pulse.

2. A phase detector as recited in claim 1 wherein said generating means comprises a snap-off diode connected to said shorted slot line to which a strobe signal is applied.

3. A phase detector as recited in claim 1 further comprising:
   a pair of sampling diodes connected to said input signal, said shorted slot line acting as a balun to provide a balanced pulse drive for said diodes; and
   a capacitor connected to the output of each of said diodes to provide a common mode output.

* * * * *